(12) United States Patent
Nielsen

(10) Patent No.: US 9,442,137 B2
(45) Date of Patent: Sep. 13, 2016

(54) METHOD AND ARRANGEMENT FOR DETERMINING AN ELECTRICAL CHARACTERISTICS AT A REGULATION POINT

(71) Applicant: Siemens Aktiengesellschaft, München (DE)

(72) Inventor: Kaj Skov Nielsen, Issaquah, WA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 284 days.

(21) Appl. No.: 13/886,438

(22) Filed: May 3, 2013

(65) Prior Publication Data

US 2014/0327430 A1 Nov. 6, 2014

(51) Int. Cl.
| | |
|---|---|
| G01R 15/12 | (2006.01) |
| F03D 7/02 | (2006.01) |
| F03D 7/04 | (2006.01) |
| H02J 3/18 | (2006.01) |
| H02J 3/38 | (2006.01) |
| G01R 15/00 | (2006.01) |
| G01R 19/25 | (2006.01) |
| H02J 3/16 | (2006.01) |

(52) U.S. Cl.
CPC .......... G01R 15/125 (2013.01); F03D 7/028 (2013.01); F03D 7/048 (2013.01); H02J 3/1821 (2013.01); H02J 3/38 (2013.01); G01R 15/002 (2013.01); G01R 19/2503 (2013.01); H02J 3/16 (2013.01); Y02E 10/723 (2013.01)

(58) Field of Classification Search
CPC .......... G01R 15/125; G01R 15/002; G01R 19/2503

USPC .................................. 324/114, 115
See application file for complete search history.

(56) References Cited

U.S. PATENT DOCUMENTS

| 2,551,943 | A * | 5/1951 | Gulow ............... H01F 29/04 200/11 TC |
| 6,924,565 | B2 * | 8/2005 | Wilkins ............... F03D 7/02 290/44 |
| 8,686,742 | B2 * | 4/2014 | Garcia ............... F03D 11/00 290/44 |
| 2009/0218817 | A1* | 9/2009 | Cardinal ............... F03D 7/028 290/44 |
| 2011/0012603 | A1* | 1/2011 | Bose ............... G01R 31/3274 324/418 |
| 2011/0254557 | A1* | 10/2011 | Makki ............... G01R 31/3274 324/418 |
| 2011/0278921 | A1* | 11/2011 | Fretheim ............... H02J 3/38 307/24 |
| 2011/0309683 | A1* | 12/2011 | Nielsen ............... F03D 7/0284 307/84 |
| 2012/0081824 | A1* | 4/2012 | Narendra ............... H02H 3/46 361/86 |

FOREIGN PATENT DOCUMENTS

| EP | 1278284 A1 | 1/2003 |
| EP | 1508951 A1 | 2/2005 |
| EP | 2397688 A1 | 12/2011 |

* cited by examiner

Primary Examiner — Jermele M Hollington
Assistant Examiner — Christopher McAndrew

(57) ABSTRACT

A method for determining electrical characteristics at a point of regulation to which plural energy providing/production units are connected via a common node is provided. The electrical characteristics at an output terminal of each of the plural energy providing/production units are measured in order to obtain plural measured electrical characteristics. Circuit configuration information about a configuration of a circuitry connected between the plural energy providing/production units and the point of regulation is obtained. Electrical characteristics at the point of regulation are calculated based on the plural measured electrical characteristics and the circuit configuration information.

13 Claims, 4 Drawing Sheets

METHOD AND ARRANGEMENT FOR DETERMINING AN ELECTRICAL CHARACTERISTICS AT A REGULATION POINT

FIELD OF INVENTION

The present application relates to a method and to an arrangement for determining an electrical characteristics at a point of regulation to which plural energy providing/production units, such as wind turbines, are connected, such as via a common node.

BACKGROUND OF INVENTION

A wind farm may comprise plural wind turbines which may be connected to a common node (also referred to as point of common coupling, PCC) which in turn may be connected to a regulation point or node at which an electrical characteristics may be required which may be set by a grid operator or by other regulations. Further, a large scale wind power plant may have multiple substations and multiple points of regulations in parallel inside the wind power plant. Compensating for a line loss may not be performed in a reliable manner using the conventional methods and algorithms typically applied in net transmission industry.

In a conventional application, there may be a single point of measurement and a single point of interconnection or single point of regulation requirements. The components between the point of measurement and the point of regulation may be described using an equivalency circuit using complex quantities or complex numbers, making it possible to derive estimated values or electric characteristics upstream or downstream from the measurement point.

It has been observed that conventional methods and arrangements for determining electrical characteristics at a point of regulation may not in all situations provide accurate and reliable results, such as in more complex arrangements or circuits between plural wind turbines at a point of regulation.

There may be a need for a method and an arrangement for determining an electrical characteristics at a point of regulation, wherein at least some of the above-mentioned disadvantages are reduced. Further, there may be a need for a method and an arrangement for determining an electrical characteristics at a point of regulation which may be capable of handling or accounting for a complex connectivity or a complex circuit between the plural wind turbines and the point of regulation.

SUMMARY OF INVENTION

This need may be met by the subject matter according to the independent claims. Embodiments of the present application are described by the dependent claims.

According to an embodiment of the present application, it is provided a method for determining an electrical characteristics at a point of regulation to which plural energy providing/production units are connected via a common node, the method comprising: measuring an electrical characteristics at an output terminal of each of the plural energy providing/production units, in order to obtain plural measured electrical characteristics, obtaining circuit configuration information about a configuration of a circuitry connected between the plural energy providing/production units and the point of regulation, and based on the plural measured electrical characteristics and the circuit configuration information, computing an electrical characteristics at the point of regulation.

The electrical characteristics at the point of regulation may comprise a definition of (predicted) electrical quantities, such as voltage, power, active power, reactive power, current, and/or power factor. An intended electrical characteristics at the point of regulation may be set e.g. by a grid operator and/or may be required to have a setting. Thus, it may be desired to achieve an (desired or intended) electrical characteristics at the point of regulation. However, the point of regulation may be remote or far apart (such as e.g. between 1 km and 100 km or between 1 km and 30 km) from the locations of the plural energy production units. In between the point of regulation and each of the plural energy providing/production units other electric/electronic/magnetic elements may be connected or arranged, such as via connecting cable sections. These electrical/electronic/magnetic components together with the cable sections may form the circuitry which is connected between the plural energy production units and the point of regulation.

The energy providing/production unit may for example comprise an energy production unit, such as a wind turbine, solar energy production unit or wave energy production unit. Alternatively or additionally the energy providing/production unit may comprise an energy storage device, such as a capacitor and/or a battery and/or accumulator. The energy providing/production unit may also referred to in the following as energy production unit.

The (actual) electrical characteristics at the output terminal of each of the plural energy production units may comprise a definition of voltage, active power, reactive power, current, power factor and so on. The measuring the electrical characteristics may be performed close to the output terminal of the respective energy production unit or somewhat remote or apart from the output terminal. The electrical characteristics at the output terminal may be measured upstream (or in other cases downstream) of a respective transformer which is associated to the respective energy production unit.

The circuit configuration information may comprise information, how the circuitry between the plural energy production units and the point of regulation is configured, e.g. which of potentially present breakers is opened or closed, how the setting of an element is (e.g. a tap position of a tap transformer, an adjustable capacity of a capacitor bank, an adjustable induction of an inductance). Further, the circuitry may be associated with a topology of elements connected together. The topology may define or represent a general architecture of the circuitry which may then be configured by opening or closing one or more breakers, or/and setting electrical characteristics of electronic/electric/magnetic elements comprised within the circuitry. Each (or at least one) element within the circuitry may have an output port for providing information regarding its current setting. This setting information of the elements comprised in the circuitry may be obtained and may as a whole form the circuit configuration information. The circuit configuration information may be obtained wire-based or wirelessly. Further, the circuit configuration information may be obtained using optical means.

The circuit configuration information (together with the topology of the circuit) may then enable to set up an equivalence diagram for the circuitry. Using physical laws of electronic circuits, the effect of the circuitry on the plural power streams output by the plural energy production units may be calculated and the electric characteristics at the point of regulation may be derived, such as using one or more formulas regarding voltage, current, active power, reactive power and/or power factor. Furthermore, a temperature of all these components comprised within the circuitry may be taken into account. A line loss or an upstream compensation model may be provided or developed according to embodiments of the present application. The line loss or upstream compensation model may be capable of estimating critical grid values even applied to relatively complex grid configurations.

The circuitry between the plural energy production units and the point of regulation may include multiple parallel connections, combinations of parallel and serial connections, transformers with automatic tap changer functions, dynamic power factor correction or discrete steps of capacitor banks or reactors, including active filters.

Furthermore, the configuration information may comprise information regarding types and electrical characteristics of the elements comprised within the circuitry. The configuration information may include information regarding one or more tap positions of one or more transformers, the state (open or closed) of one or more breakers, the values of transformation ratios, values of capacities of capacitors, information regarding cable length of cable sections, information regarding cable type (such as cross-sectional area, and/or material, cable capacitance, impedance, reactance, temperature coefficients, shielding, etc.), and/or information regarding temperature specific to the components comprised within the circuitry.

The determined electrical characteristics and the point of regulation may then be used for controlling the plural energy production units, such as wind turbines, such as using a closed loop regulation.

For each topology or each of the circuitries, there may be an equivalency diagram describing the circuitry in enough detail to establish the simulated upstream and/or downstream values with enough accuracy. The electrical characteristics at the point of regulation may be reliably and accurately determined or computed.

The method may support a number of topologies or a number of circuitry types, each may have a unique set of topology identifiers. For example, topology A, topology B, topology C may describe the number of supported configurations of switchings or settings that is available within the circuitry. These switchings or settings may for example comprise closing or opening of tie breaker or it may comprise the position(s) of tap changers. Further, closing or opening of capacitor banks may be specified within the configuration information. All changes to the topology (or setting) of the circuitry may be monitored and may be available as input to the method, such as the line drop compensation algorithm, such as embodied as or derivable from the configuration information. Contribution from dynamic compensation systems may be transferred to the line drop algorithm as numeric values.

Further, each topology (or each supported type of circuitry) may be associated with a unique set of parameters for each of the components in the equivalency diagram best describing the actual impact on the circuit. Furthermore, the actual measurements from each of the measurement points (of the energy production units) may be input to the line drop compensation model. The obtained measurements may include voltage, reactive power, active power, power factor, frequency, harmonics, etc. The model output (such as the electrical characteristics at the point of regulation) may be represented by the same set of variables or a different set of variables. The output (such as the electrical characteristics at the point of regulation) may specifically include a numeric value for the combined system loss. The line drop model may be represented as a true model of the grid or it may be represented as even a rough approximation with a single set of parameters representing multiple topologies if this is appropriate for the given applications. A typical model may include as a minimum representations of impedance, capacitance and inductance which may be connected in any applicable manner. The model could also be or include a neural network trained by a set of test measurements.

According to an embodiment of the present application, the circuit comprises at least one transformer (or none transformer at all in another embodiment) connectable between an output terminal of an energy production unit of the plural energy production units and the common node, wherein the circuit comprises at least one breaker arranged at a low voltage side and/or a high voltage side of the transformer, wherein the configuration information indicates whether the at least one breaker is closed or opened.

The breaker (and any breaker mentioned herein) may represent a (high power) switch. The breaker may comprise a mechanical and/or electronic switch.

The transformer may comprise a primary winding and a secondary winding (or multiple secondary windings) inductively coupled to the primary winding. A voltage at the primary winding may be transformed to a secondary voltage at the secondary winding which may be different from the primary voltage, wherein a transformation ratio may define the ratio between the primary voltage and the secondary voltage. The transformer may be disconnected (using a breaker) at its primary side or at its secondary side depending on the application. Each transformer may comprise a primary breaker connected at its primary side and/or a secondary breaker connected at its secondary side, wherein the primary breaker and the secondary breaker may be controlled independently from each other regarding closing and opening. A voltage output by one of the energy production units may be transformed to another voltage (such as higher voltage) which may then be more effectively transferred over long distances without involving extended energy loss. A typical configuration of a wind farm may be supported.

According to an embodiment of the present application, a transformation ratio of the transformer is adjustable by changing a tap position of the transformer, wherein the configuration information indicates the tap position of the transformer.

Changing the tap position of the transformer may be used in order to achieve a desired characteristics at the point of regulation. A flexibility may be increased and also typical configurations may be supported.

According to an embodiment of the present application, the transformer comprises an auto-tap changer. The auto tap changers may be regulating based on the low voltage side of the transformers in order to ensure that the low voltage is kept inside the acceptable voltage range. But the tap changer can also be controlled to increase the overall reactive capability of the entire plant. The tap position may automatically change in response to the low voltage side dropping below a low voltage trigger point or it may automatically change in response to the high voltage side increasing above a high voltage trigger limit According to an embodiment of the present application, the circuit comprises a capacitor and at least one further breaker, wherein the configuration information indicates whether the at least one further breaker is opened or closed, the further breaker being arranged between a bar connected to the common node and the capacitor.

The capacitor may be used to affect reactive power during the application of transferring energy from the plural production units to the point of regulation. A reactive power may be achieved at the point of regulation, by connecting or disconnecting the capacitor or setting the capacitor to have a capacity. A desired electrical characteristics at the point of regulation may be achieved.

According to an embodiment of the present application, the circuit comprises an inductor and/or filter and at least one still further breaker, wherein the configuration information indicates whether the at least one still further breaker is opened or closed, the still further breaker being arranged between a bar connected to the common node and the inductor.

Also the inductor may change a reactive power at the point of regulation depending on whether the inductor is connected or disconnected from the bar which is connected to the common node. Furthermore, the inductor may be an adjustable inductor whose inductance may be adjustable, such as in several different settings. The configuration information may comprise also the current setting of the adjustable inductor.

According to an embodiment of the present application, the circuit comprises an electric cable connecting at least one of the plural production units to the common node and/or connecting the common node to the point of regulation, wherein the configuration information indicates a length and/or type and/or electric properties of the cable.

The electric cable may comprise one or more cable sections connecting electronic/magnetic/electric components comprised within the circuitry. The electric cable may be characterized by its cross-section shape and/or cross-sectional area and/or material and/or length and/or shielding and/or impedance and/or capacitance and/or inductance and so forth. This kind of information may be included within the configuration information. The determination of the electrical characteristics at the point of regulation may be improved, such as regarding its accuracy.

According to an embodiment of the present application, the method further comprises computing a transfer loss from the plural sites to the common node and/or from the common node to the point of regulation based on the circuit configuration information and the measured characteristics of the plural energy portions, and computing an electrical characteristics at the point of regulation based on the computed transfer loss.

The transfer loss may comprise an active energy loss, a reactive energy loss, a voltage loss or voltage drop, a current loss and so forth and may represent an influence of the circuitry on individual power streams from the plural energy production units to the point of regulation. The transfer loss may for example be computed using a mathematical formula or/and using a mathematical/physical model of the circuitry. The configuration of the circuitry may be taken into account.

According to an embodiment of the present application, measuring an electrical characteristics at an output terminal of each of the plural energy production units includes measuring a voltage and/or reactive power and/or active power and/or power factor and/or electrical harmonics of a power stream output by the respective energy production unit.

Some of the important electrical quantities may be taken into account for accurately determining the electrical characteristics at the point of regulation.

According to an embodiment of the present application, a cable length to the common node is different for at least two energy production units. Since the configuration information may include information regarding the lengths of cable sections within the circuitry, the different cable lengths from different energy production units to the point of regulation may be taken into account, in order to improve the determination of the electrical characteristics at the point of regulation.

According to an embodiment of the present application, it is provided a method for controlling plural energy production units connected at a common node connected to a point of regulation, the method comprising performing a method for determining an electrical characteristics at the point of regulation according to one of the above described embodiments, and controlling at least one of the plural energy production units based on a desired electrical characteristics at the point of regulation and the determined electrical characteristics at the point of regulation.

Controlling the at least one of the plural energy production units may comprise sending one or more reference values (such as reference voltage, reference power, reference reactive power e.g.) to the energy production unit (such as to a converter of the energy production unit). The energy production unit may comprise an AC-DC-AC converter which is electrically coupled to a generator of the energy production unit, such as a wind turbine. The converter may comprise plural semiconductor controllable switches, such as IGBT-transistors, which convert a variable frequency AC power stream to a fixed frequency AC power stream. The converter may such as control a torque of the generator, a portion of energy what is extracted from the rotor of the wind turbine, controlling voltage and/or power and/or reactive power and/or current at the output terminal of the respective energy production unit.

The controlling may involve a closed loop control method. In a closed loop control method, a desired value (such as voltage, active power (e.g. measured in units of W (Watt) or MW (Mega Watt) or GW (Giga Watt)), reactive power (e.g. measured in units of VAr or MVAr or GVAr), apparent power (e.g. measured in units of Volt Ampere (VA) or Mega Volt Ampere (MVA) or Giga Volt Ampere (GVA)), current, power factor) may be compared with an actual (e.g. measured) value and a control line (such as a PID-controller) may be arranged to reduce a deviation between the desired value and the actual value. The controller may comprise a cascaded controller which may act on several levels. The desired electrical characteristics at the point of regulation may be more accurately achieved.

According to an embodiment of the present application, the at least one of the plural energy production units is controlled to compensate for a transfer loss from the plural energy production units to the point of regulation. The method may be considered as a method for calibrating control signals to be sent to the plural energy production units, in order to achieve a desired electrical characteristics at the point of regulation.

It should be understood that features which have been individually or in any combination disclosed, described, explained or mentioned with respect to a method for determining an electrical characteristics at a point of regulation may also be applied, provided for or employed to an arrangement for determining an electrical characteristics at a point of regulation according to an embodiment of the present application and vice versa.

According to an embodiment of the present application, it is provided an arrangement for determining an electrical characteristics at a point of regulation to which plural energy production units are connected via a common nodes, the arrangement comprising: at least one input port which is adapted for receiving plural measured electrical characteristics obtained at an output terminal of each of the plural energy production units and for receiving circuit configuration information about a configuration of a circuitry connected between the plural energy production units and the point of regulation, and a processor which is adapted to, based on the plural measured electrical characteristics and the circuit configuration information, compute (and e.g. output) an electrical characteristics at the point of regulation.

The arrangement may be comprised in a wind farm controller controlling the plural energy production unit.

According to an embodiment of the present application, it is provided an arrangement for controlling plural energy production units connected at a common node connected to a point of regulation, the arrangement comprising an arrangement for determining an electrical characteristics at the point of regulation according to the preceding embodiment, which is further adapted to control at least one of the plural energy production units based on a desired electrical characteristics at the point of regulation and the determined electrical characteristics at the point of regulation.

Embodiments of the present application are now described with reference to the accompanying drawings. The application is not limited to the illustrated or described embodiments.

It has to be noted that embodiments of the application have been described with reference to different subject matters. Some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, such as between features of the method type claims and features of the apparatus type claims is considered as to be disclosed with this document.

BRIEF DESCRIPTION OF THE DRAWINGS

The aspects defined above and further aspects of the present application are apparent from the examples of embodiment to be described hereinafter and are explained with reference to the examples of embodiment. The application will be described in more detail hereinafter with reference to examples of embodiment but to which the application is not limited.

DETAILED DESCRIPTION OF INVENTION

Figure 1:
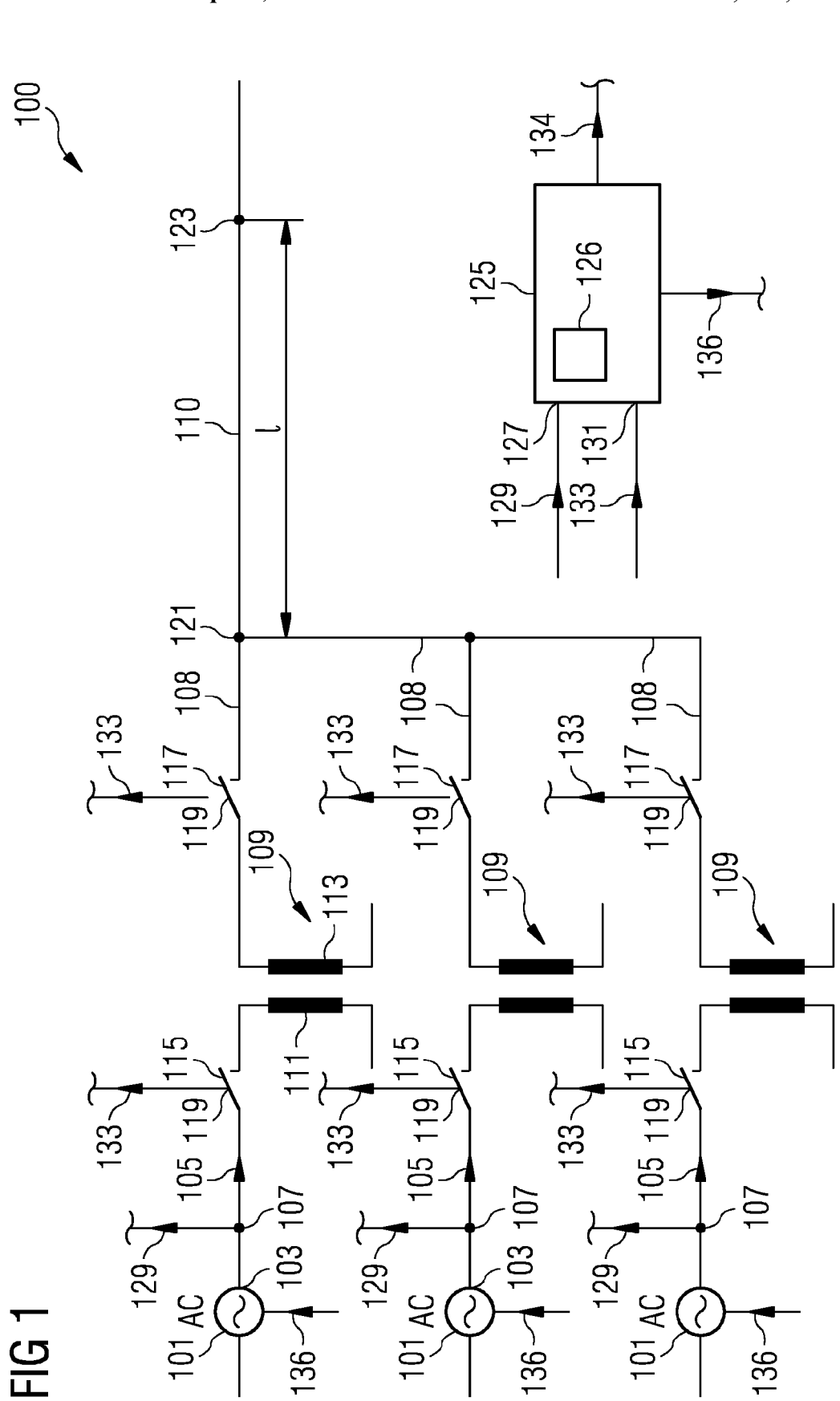
FIG. 1 schematically illustrates a diagram of an energy production system for which a method for determining an electrical characteristics at a point of regulation according to an embodiment of the present application may be performed.

The illustration in the drawings is in schematic form. It is noted that in different figures, similar or identical elements are provided with the same reference signs or with reference signs, which are different from the corresponding reference signs only within the first digit.

FIG. 1 schematically illustrates an energy producing system 100 including an arrangement for determining an electrical characteristics at a point of regulation can be applied according to an embodiment of the present application. For the energy producing system 100 a method for determining an electrical characteristics at a point of regulation can be applied according to an embodiment of the present application.

Figure 4:
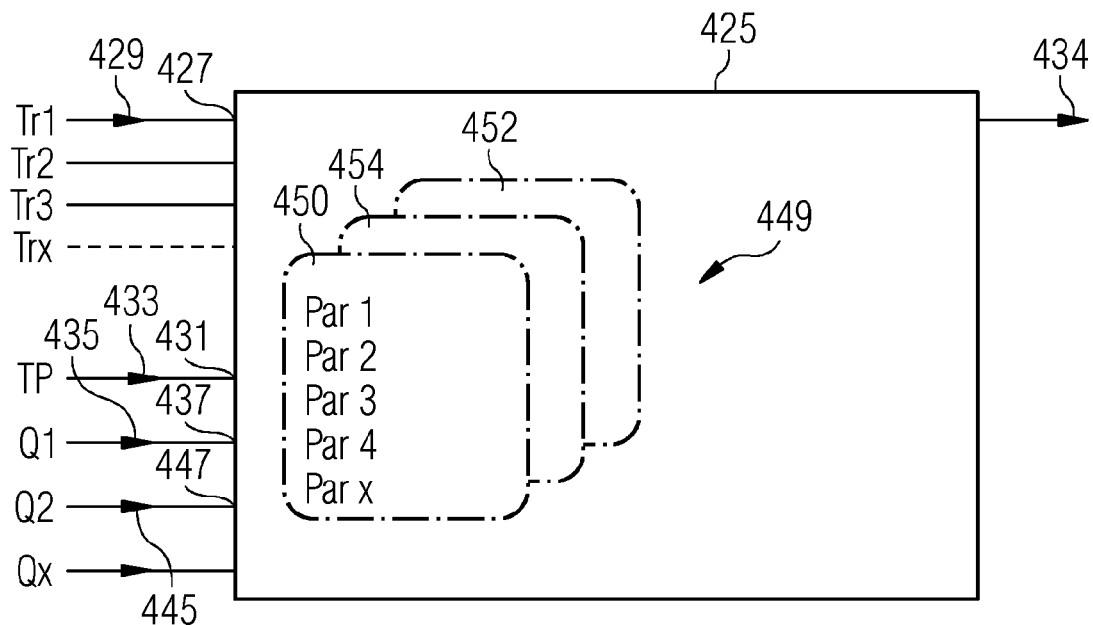
FIG. 4 schematically an arrangement for determining an electrical characteristics at a point of regulation according to an embodiment of the present application which may perform a method for determining an electrical characteristics at a point of regulation according to an embodiment of the present application, for example applied to the system illustrated in FIG. 1, 2 or 3.

The system 100 includes plural energy production units 101 which may for example be wind turbines and which may provide a voltage source or a power source. The energy production units have output terminals 103 at which a respective power output stream 105 is output. At measurement points 107, electrical characteristics of the power stream 105 (such as for example regarding voltage, current, active power, reactive power) are measured using not illustrated measurement equipment. Each energy production unit comprises a transformer 109 having a primary winding 111 and a secondary winding 113 inductively coupled to the primary winding 111. At the primary side of the transformer of each energy production unit 101, a breaker 115 is provided which may be switched to a closed or to an open configuration. Also, at the secondary side of the transformer 109, each energy production unit 101 has a breaker 117 which may be switched in a closed or in an open state. Each of the breakers 115, 117 comprises a state information output terminal 119 which provides information regarding the state of the respective breaker 115, 117 to be transmitted or sent to an arrangement 125 for determining an electrical characteristics at a point of regulation according to an embodiment of the present application, such as arrangement 425, as illustrated in FIG. 4.

The energy production units 101 are connected with each other at a point of common coupling 121, wherein a cable length from the energy production units 101 to the point of common coupling 121 differs between different energy production units. The point of common coupling 121 is further connected to a point of regulation 123 which is spaced apart from the point of common coupling 121 by a distance 1. The distance 1 may be for example between 10 km and 100 km. Measurement values about the characteristics of the energy production units 101 which have been acquired at the measurement points 107 are used together with circuit configuration information, in order to compute an electrical characteristics at the point of regulation 123.

For this purpose, an arrangement 125 for determining an electrical characteristics of a point of regulation is provided which receives at an input port 127 plural measured electrical characteristics 129 obtained at the measurement points 107, wherein the signals indicative for the plural electrical characteristics are labelled with reference sign 129. Further, the arrangement 125 receives at an input port 131 signals 133 which code for circuit configuration information comprising the state signals 133 provided by the breakers 115, 117. The arrangement 125 for determining an electrical characteristics at a point of regulation according to an embodiment of the present application receives signals 129 and 133 and computes, based on the state information 133 of the breaker 115, 119, and the measurement signal 129, an electrical characteristics 134 representing electrical properties at the point of regulation 123. The arrangement comprises a processor 126.

The arrangement 125 for determining an electrical characteristics at the point of regulation is further adapted to control (by outputting control signals 136) at least one of the plural energy production units 101 (which receive the control signal 136) based on a desired electrical characteristics at the point of regulation 123 and the determined electrical characteristics 134 at the point of regulation. This function is also provided for the arrangements 225, 325 and 425 in FIGS. 2, 3 and 4.

Figure 2:
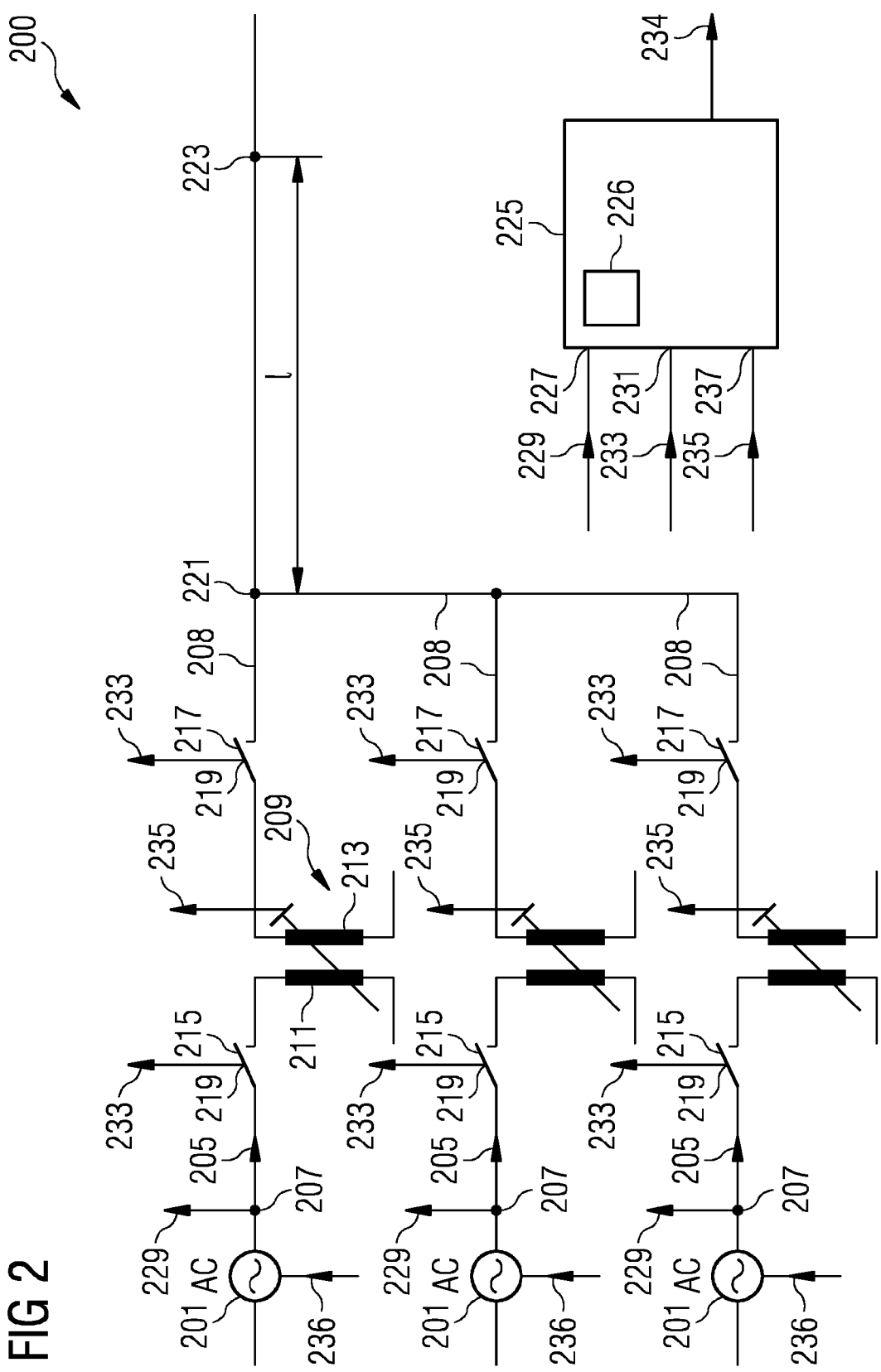
FIG. 2 illustrates a schematic diagram of an energy producing system for which a method for determining an electrical characteristics at a point of regulation according to an embodiment of the present application may be performed.

FIG. 2 illustrates another energy production system 200 in a schematical manner which performs a method for determining an electrical characteristics at a point of regulation according to a method according to an embodiment of the present application using an arrangement 225 for determining an electrical characteristics at a point of regulation according to an embodiment of the present application.

It should be noted that elements similar in structure and/or function in the FIGS. 1, 2, 3 and 4 are labelled with the same reference numerals differing only in the first digit.

The system 200 illustrated in FIG. 2 has similarities and some components in common with the system illustrated in FIG. 1. However, differing from the transformers 109 illustrated in FIG. 1 in that the transformers 209 associated with a respective energy production unit 201 represent tap transformers, i.e. transformers which enable to adjust a transformation ratio by changing a tap position. Information regarding the tap position is provided from the respective transformer 209 via a tap position signal 235 indicating the tap position of the respective transformer or a transformation ratio of the respective transformer. Additionally to the input signals received at the arrangement 125 illustrated in FIG. 1, the arrangement 225 for determining an electrical characteristics at a point of regulation according to an embodiment of the present application further receives (at another input port 237) and computes, based on the tap position signal 235, the state information 233 of the breaker 215, 219, and the measurement signal 229, an electrical characteristics 234 representing electrical properties at the point of regulation 223.

Figure 3:
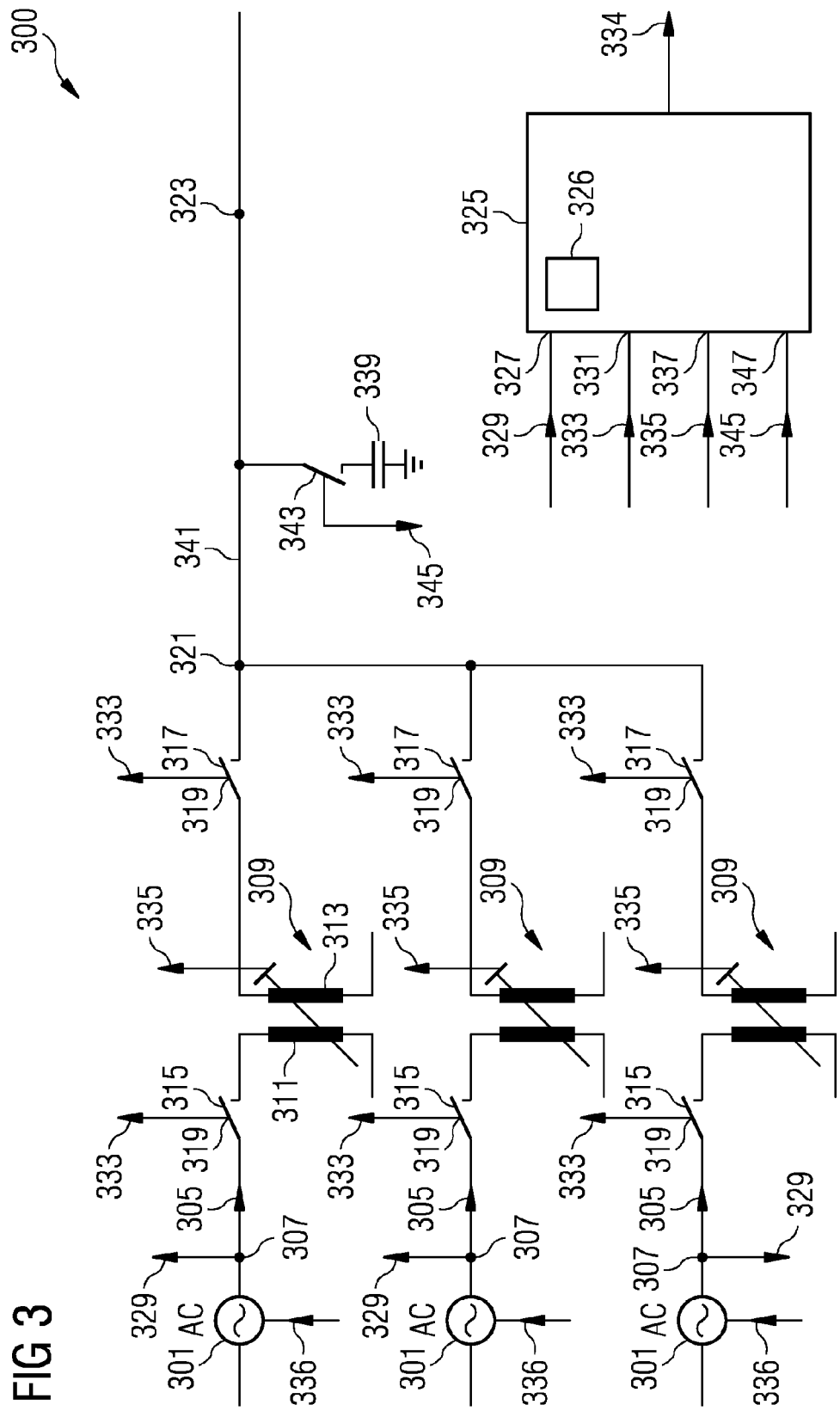
FIG. 3 illustrates a schematic diagram of an energy producing system for which a method for determining an electrical characteristics at a point of regulation according to an embodiment of the present application may be performed.

FIG. 3 schematically illustrates an energy production system 300 performing a method for determining an electrical characteristics at a point of regulation according to an embodiment of the present application and including an arrangement 325 for determining an electrical characteristics at a point of regulation according to an embodiment of the present application.

The system illustrated in FIG. 3 has a number of components in common with the system 200 illustrated in FIG. 2 but further includes a capacitor or a capacitor bank 339 which is connected at a bar 341 connecting the point of common coupling 321 and the point of regulation 323. Further, the capacitor 339 is connected to the bar 341 via a breaker 343 which provides a state signal 345 regarding its connection state to the arrangement 325. The arrangement 325 may consider also the state of the breaker 343 (forming a part of configuration information of the circuitry) for computing the electrical characteristics 324 at the point of regulation 323.

FIG. 4 illustrates in a schematical manner an arrangement 425 for determining an electrical characteristics at a point of regulation according to an embodiment of the present application, wherein the arrangement 425 may for example be used in FIG. 1 as the arrangement 125, in FIG. 2 as the arrangement 225, and in FIG. 3 as the arrangement 325.

Plural measurement values 429 are received at an input port 427. Furthermore, plural signals regarding a configuration information, i.e. signals 433, 435 and 445 are received at respective input ports 431, 437, 447. The input signals 433, 435, 445 represent configuration information regarding the respective (such as topology and/or configuration or) circuitry between the plural energy production units and the respective point of regulation.

Figure 5:
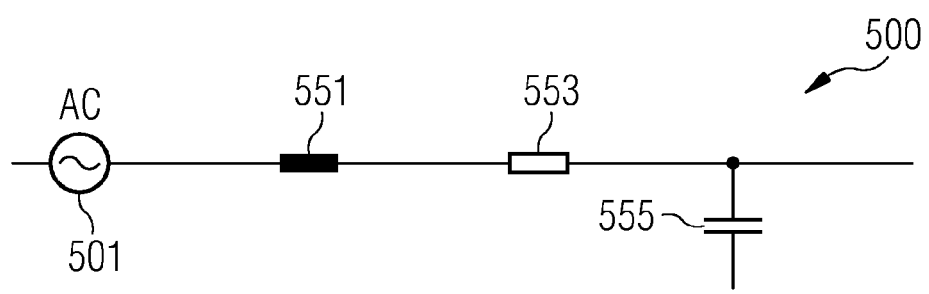
FIG. 5 illustrates an energy producing system for which a conventional method or a method according to an embodiment may be performed.

The arrangement 425 comprises a storage 449 storing a number of parameter sets 450, 454, 452 for different topologies of the circuitry between the plural energy production units and the point of regulation. The configuration input signals 433, 435, 445 are associated with a parameter set of the applied circuitry or the applied topology of the circuitry and based on the configuration information, the arrangement 425 computes a signal 434 representing an electrical characteristics at the point of regulation, for example the signal 434 may indicate a voltage, an active power, a reactive power, a current and/or a power factor at the point of regulation. The measurement values 433, 435, 445 may include voltage, reactive power, active power, power factor, frequency, harmonics, etc. at the measurement points close to the energy production units. The arrangement 425 may represent a line drop model as a true model of the grid or it may represent it as even a rough approximation with a single set of parameters representing multiple topologies, if this is appropriate for the given applications. A typical model supported by the arrangement 425 may include in a minimal representation impedance, capacitance and inductance, as is schematically illustrated in FIG. 5, wherein the inductance is labelled with reference sign 551, the impedance is labelled with reference sign 553 and the capacitance is labelled with reference sign 555.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The invention claimed is:

1. A method for determining an electrical characteristics at a point of regulation to which plural energy providing/production units are connected via a common node, comprising:

measuring an electrical characteristics at an output terminal of each of the plural energy providing/production units to obtain plural measured electrical characteristics;

obtaining a circuit configuration information about a configuration of a circuit connected between the plural energy providing/production units and the point of regulation; and computing the electrical characteristics at the point of regulation based on the plural measured electrical characteristics and the circuit configuration information;

wherein the circuit comprises an electric cable connecting at least one of the plural energy providing/production units to the common node and/or connecting the common node to the point of regulation, and wherein the circuit configuration information indicates electric properties of the electric cable in dependence of a temperature of the electric cable,
wherein the circuit comprises a capacitor and at least one breaker, wherein the circuit configuration information indicates whether the at least one breaker is opened or closed, the at least one breaker being arranged between a bar connected to the common node and the capacitor or/and the circuit configuration information indicates electrical characteristics of electronic/electric/magnetic elements comprised within the circuitry.

2. The method according to claim 1,
wherein the circuit comprises at least one transformer connectable between the output terminal of the each of the plural energy providing/production units and the common node,
wherein the circuit comprises at least one breaker arranged at a low voltage side and/or a high voltage side of the transformer, and
wherein the circuit configuration information indicates whether the at least one breaker is closed or opened.

3. The method according to claim 2, wherein a transformation ratio of the transformer is adjustable by changing a tap position of the transformer, and wherein the circuit configuration information indicates the tap position of the transformer.

4. The method according to claim 2, wherein the transformer comprises an auto-tap changer.

5. The method according to claim 1, wherein the circuit comprises an inductor and/or filter and at least one still breaker and/or a bypass bypassing the inductor, wherein the circuit configuration information indicates whether the at least one still breaker is opened or closed, the at least one still breaker being arranged to selectively bypassing the inductor.

6. The method according to claim 1, wherein the circuit configuration information indicates a length and/or type of the electric cable.

7. The method according to claim 1, further comprising:
computing a transfer loss from the plural energy providing/production units to the common node and/or from the common node to the point of regulation based on the circuit configuration information and the measured characteristics of the plural energy portions; and
computing the electrical characteristics at the point of regulation based on the computed transfer loss.

8. The method according to claim 1, wherein measuring the electrical characteristics at the output terminal of each of the plural energy providing/production units comprises measuring a voltage and/or reactive power and/or active power and/or power factor and/or electrical harmonics of a power stream output by each of the plural energy providing/production units.

9. The method according to claim 1, wherein a cable length to the common node is different for at least two of the energy providing/production units.

10. A method for controlling plural energy providing/production units connected at a common node and connected to a point of regulation, comprising:
performing a method for determining an electrical characteristics at the point of regulation according to claim 1; and
controlling at least one of the plural energy providing/production units based on a desired electrical characteristics at the point of regulation and the computed electrical characteristics at the point of regulation.

11. The method according to claim 10, wherein the at least one of the plural energy providing/production units is controlled to compensate for a transfer loss from the plural energy providing/production units to the point of regulation.

12. An arrangement for determining an electrical characteristics at a point of regulation to which plural energy providing/production units are connected via a common node, comprising:
at least one input port which is adapted to:
receive plural measured electrical characteristics obtained at an output terminal of each of the plural energy providing/production units; and
receive a circuit configuration information about a configuration of a circuit connected between the plural energy providing/production units and the point of regulation,
wherein the circuit comprises a capacitor and at least one breaker, wherein the circuit configuration information indicates whether the at least one breaker is opened or closed, the at least one breaker being arranged between a bar connected to the common node and the capacitor; and
a processor which is adapted to compute the electrical characteristics at the point of regulation based on the plural measured electrical characteristics and the circuit configuration information,
wherein the circuit comprises an electric cable connecting at least one of the plural energy providing/production units to the common node and/or connecting the common node to the point of regulation, and wherein the circuit configuration information indicates electric properties of the electric cable in dependence of a temperature of the electric cable.

13. The arrangement according to claim 12, wherein the arrangement is adapted to control at least one of the plural energy providing/production units based on a desired electrical characteristics at the point of regulation and the computed electrical characteristics at the point of regulation.

* * * * *